(12) United States Patent
Ritter

(10) Patent No.: US 11,844,191 B2
(45) Date of Patent: Dec. 12, 2023

(54) APPARATUS FOR HEAT MANAGEMENT IN AN ELECTRONIC DEVICE

(71) Applicant: Thomson Licensing, Cesson-Sevigne (FR)

(72) Inventor: Darin Ritter, Indianapolis, IN (US)

(73) Assignee: Thomson Licensing, Cesson-Sevigne (FR)

( * ) Notice: Subject to any disclaimer, the term of this patent is extended or adjusted under 35 U.S.C. 154(b) by 10 days.

(21) Appl. No.: 17/613,105

(22) PCT Filed: May 29, 2020

(86) PCT No.: PCT/EP2020/064968
§ 371 (c)(1),
(2) Date: Nov. 22, 2021

(87) PCT Pub. No.: WO2020/239977
PCT Pub. Date: Dec. 3, 2020

(65) Prior Publication Data
US 2022/0225533 A1 Jul. 14, 2022

Related U.S. Application Data

(60) Provisional application No. 62/853,733, filed on May 29, 2019.

(51) Int. Cl.
*H05K 7/20* (2006.01)
(52) U.S. Cl.
CPC ..... *H05K 7/20163* (2013.01); *H05K 7/20145* (2013.01); *H05K 7/20472* (2013.01)

(58) Field of Classification Search
CPC .......... H05K 7/20127–20163; H05K 7/20509; H05K 7/20445; H05K 7/20454; H05K 7/20472; G06F 1/20
See application file for complete search history.

(56) References Cited

U.S. PATENT DOCUMENTS

| | | | | |
|---|---|---|---|---|
| 4,400,858 | A * | 8/1983 | Goiffon | E21B 47/017 24/546 |
| 7,180,736 | B2 * | 2/2007 | Glovatsky | H05K 7/1434 361/688 |
| 9,069,535 | B2 * | 6/2015 | Degner | H05K 7/20145 |
| 9,431,687 | B2 * | 8/2016 | Bonebright | H01M 10/486 |
| 9,717,161 | B2 * | 7/2017 | Katsumata | H05K 7/20254 |
| 10,212,816 | B2 * | 2/2019 | Rieke | H05K 7/20863 |
| 10,455,202 | B2 * | 10/2019 | Gu | H04N 9/3173 |
| 2004/0114330 | A1 | 6/2004 | Yazawa | |

(Continued)

*Primary Examiner* — Zachary Pape
(74) *Attorney, Agent, or Firm* — Vincent Edward Duffy

(57) ABSTRACT

An apparatus and heat management mechanism are described. The apparatus includes an outer casing enclosing at least one heat generating electronic structure, such as a plurality of electronic components included on at least printed circuit board, the outer casing having an inner surface and an outer surface. The apparatus and the heat management mechanism further include a heat dissipation structure thermally coupled to the heat generating structure or printed circuit board, the heat dissipation structure forming an open-ended columnar channel, the open-ended columnar channel allowing air to flow within the heat dissipation structure in a direction parallel to a surface of the heat generating structure or printed circuit board.

18 Claims, 14 Drawing Sheets

(56) References Cited

U.S. PATENT DOCUMENTS

2013/0292095 A1 11/2013 Moore
2016/0246338 A1 8/2016 Stavi
2019/0020713 A1 1/2019 Hulick et al.

* cited by examiner

APPARATUS FOR HEAT MANAGEMENT IN AN ELECTRONIC DEVICE

This application claims the benefit, under 35 U.S.C. § 365 of International Application PCT/EP2020/064968, filed May 29, 2020, which was published in accordance with PCT Article 21(2) on Dec. 3, 2020, in English and which further claims the benefit of provisional application U.S. 62/853,733, filed on May 29, 2019.

FIELD

The present disclosure relates to an electronic device and an associated heat management device and assembly mechanism therein.

BACKGROUND

The present disclosure may be applicable to most electronic devices that include a heat management mechanism. Such electronic apparatuses or devices in the field are described as being typically assembled apparatuses having a plurality of walls and a top and a bottom surface that is generally designed to encase and protect interior components. Some exemplary electronic devices include, but are not limited to, set-top boxes, over-the-top media devices, gateways, and the like.

Most designs of these electronic apparatuses are such that the top plan view shape is rectangular, and the apparatuses are horizontal electronic apparatuses in which the height of the apparatuses is smaller than the horizontal width of the front wall, rear wall, and the side walls. Such horizontal devices are mechanically stable given their wide bases and their tops being planar horizontal structures. However, the form factor of horizontal devices requires a significant amount of shelf space and may not be convenient for electronic devices that may stand alone and/or may be placed in a location with more vertical than horizontal space available.

New vertical electronic apparatuses are more prevalent in design for the consumer electronics and communication devices market in which the height of the apparatuses is larger than the horizontal width of at least one of the walls. The need for a heat management system remains paramount despite the shift in design, particularly given the desire for a compact vertical design. The compact vertical design, along with ever increasing performance and feature requirements, creates an interior vertical space that is crowded with heat generating electronic components. As such, there is a need for such a system that can appropriately spread, dissipate and/or expel heat and yet not interfere with the interior electrical components and additionally minimize impact to, or even enhance, mechanical assembly and structural integrity. In many cases, there is a further need for the heat management system to minimize any requirement that increases the interior volume of the device.

SUMMARY

These and other drawbacks and disadvantages presented by vertically oriented devices are addressed by the principles of the present disclosure, which are directed to a heat management mechanism in an electronic device. However, it can be understood by those skilled in the art that the principles of the present disclosure may offer advantages in horizontally oriented devices as well.

According to an implementation, an apparatus is described. The apparatus includes an outer casing enclosing a plurality of electronic components included on at least one printed circuit board, the outer casing having an inner surface and outer surface. The apparatus further includes a heat dissipation structure coupled to the at least one printed circuit board, the heat dissipation structure forming an open-ended columnar channel, the open-ended columnar channel allowing air to flow within the heat dissipation structure in a direction parallel to the at least one printed circuit board.

According to an implementation, a heat management device is described. The heat management device includes a heat dissipation structure thermally coupled to a heat generating electronic structure, the heat dissipation structure forming an open-ended columnar channel, the open-ended columnar channel allowing air to flow within the heat dissipation structure in a direction parallel to a planar surface of the heat generating electronic structure.

BRIEF DESCRIPTION OF THE DRAWINGS

The principles of the present disclosure may be better understood in accordance with the following exemplary figures, in which.

DETAILED DESCRIPTION

The present disclosure may also be applicable to electronic apparatuses or devices in the field described as being typically assembled apparatuses having a plurality of walls and a heat management system or mechanism including one or more heatsinks. The present disclosure also addresses how the heat management system or mechanism including one or more heatsinks may be incorporated into an assembly process for the electronic apparatuses and devices.

The present description illustrates the principles of the present disclosure. It will thus be appreciated that those skilled in the art will be able to devise various arrangements which, although not explicitly described or shown herein, embody the principles of the present disclosure and are included within the scope of the claims.

All examples and conditional language recited herein are intended for pedagogical purposes to aid the reader in understanding the principles of the present disclosure and the concepts contributed by the inventor(s) to furthering the art and are to be construed as being without limitation to such specifically recited examples and conditions.

Moreover, all statements herein reciting principles, aspects, and embodiments of the principles of the present disclosure, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Turning to FIGS. 1-4, several views of an exemplary device 100 including a heat management mechanism according to aspects of the present disclosure are shown. Electronic device 100 is primarily oriented in a vertical arrangement. It is important to note that although electronic device 100 is shown have a particular shape, electronic device 100 may take on a shape other than that shown without deviating from the principles of the present disclosure. Because vertically oriented electronic devices appear to be of interest in the consumer market, some focus of the current principles, such as the principles of the heat management mechanism described herein, are applied to vertically oriented electronic devices but these principles may also be applied to electronic devices arranged in a more horizontal orientation. The same reference numbers will be maintained throughout the description of FIGS. 1-4.

Figure 1:
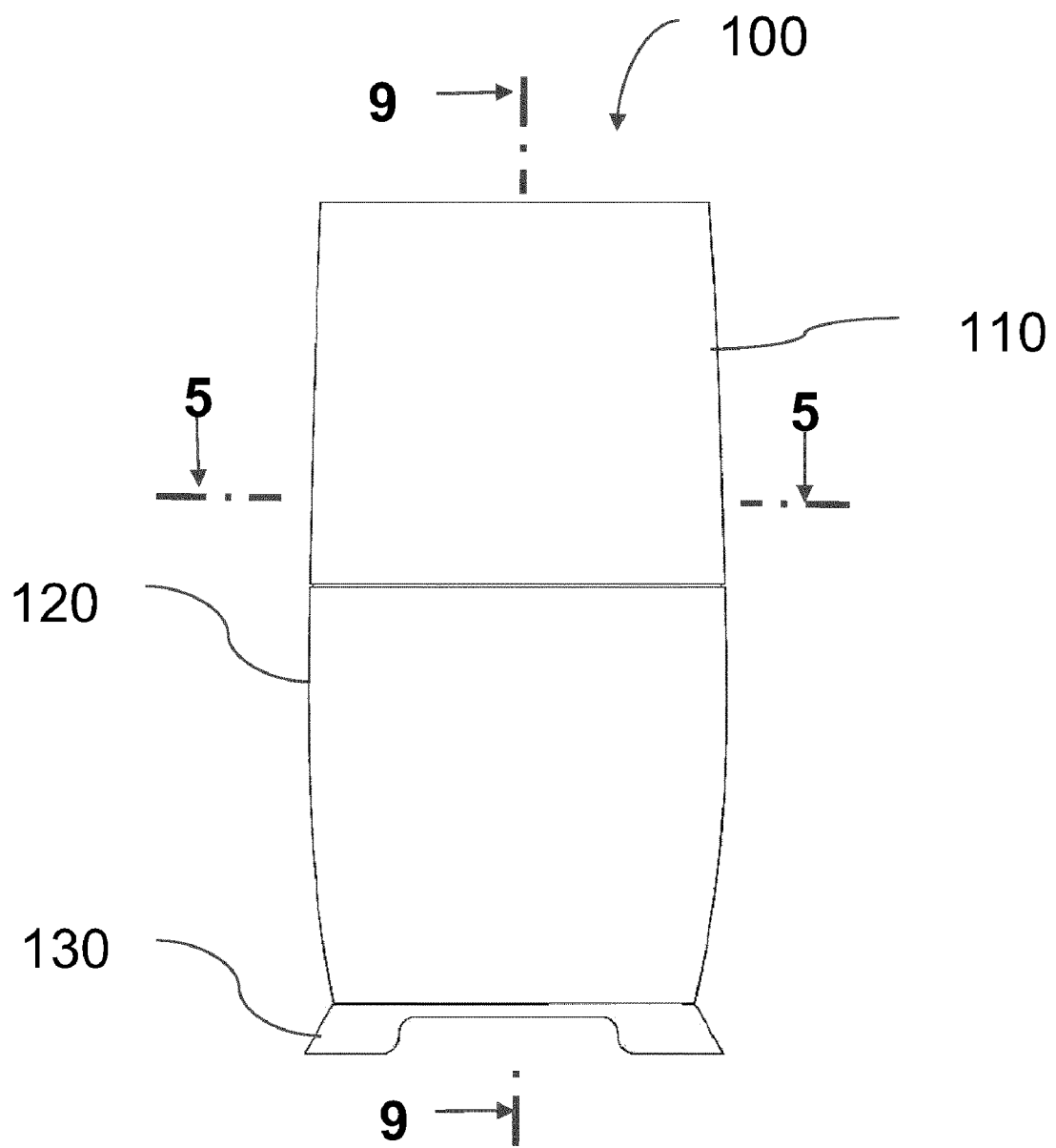
FIG. 1 is a side view of a vertically oriented electronic device to which the principles of the present disclosure are applicable.

FIG. 1 shows a side view of an exemplary electronic device 100. The electronic device 100 includes an upper case 110, a lower case 120, and a base 130. The upper case 110 and lower case 120 may be assembled using any one of several mechanical coupling mechanisms. In one embodiment, the upper case 110 and lower case 120 may be mechanically coupled using a combination hook and latch mechanism. The hook and latch mechanism includes one or more hook mechanisms located on at or near the mating edge of the interior surface of one of the faces or vertical planes of both upper case 110 and lower case 120. The hook and latch mechanism also includes one or more latch mechanisms located at or near the mating edge of the interior surface of one of the faces or vertical planes opposite the location of the hook mechanisms on both upper case 110 and lower case 120. The hook and latch mechanism may be created in plastic as part of the plastic molding process while creating upper case 110 and lower case 120. An additional mechanical coupling mechanism is used for assembly of base 130 to the bottom section of lower case 120 including, but not limited to, the combination hook and latch mechanism described above.

Figure 2:
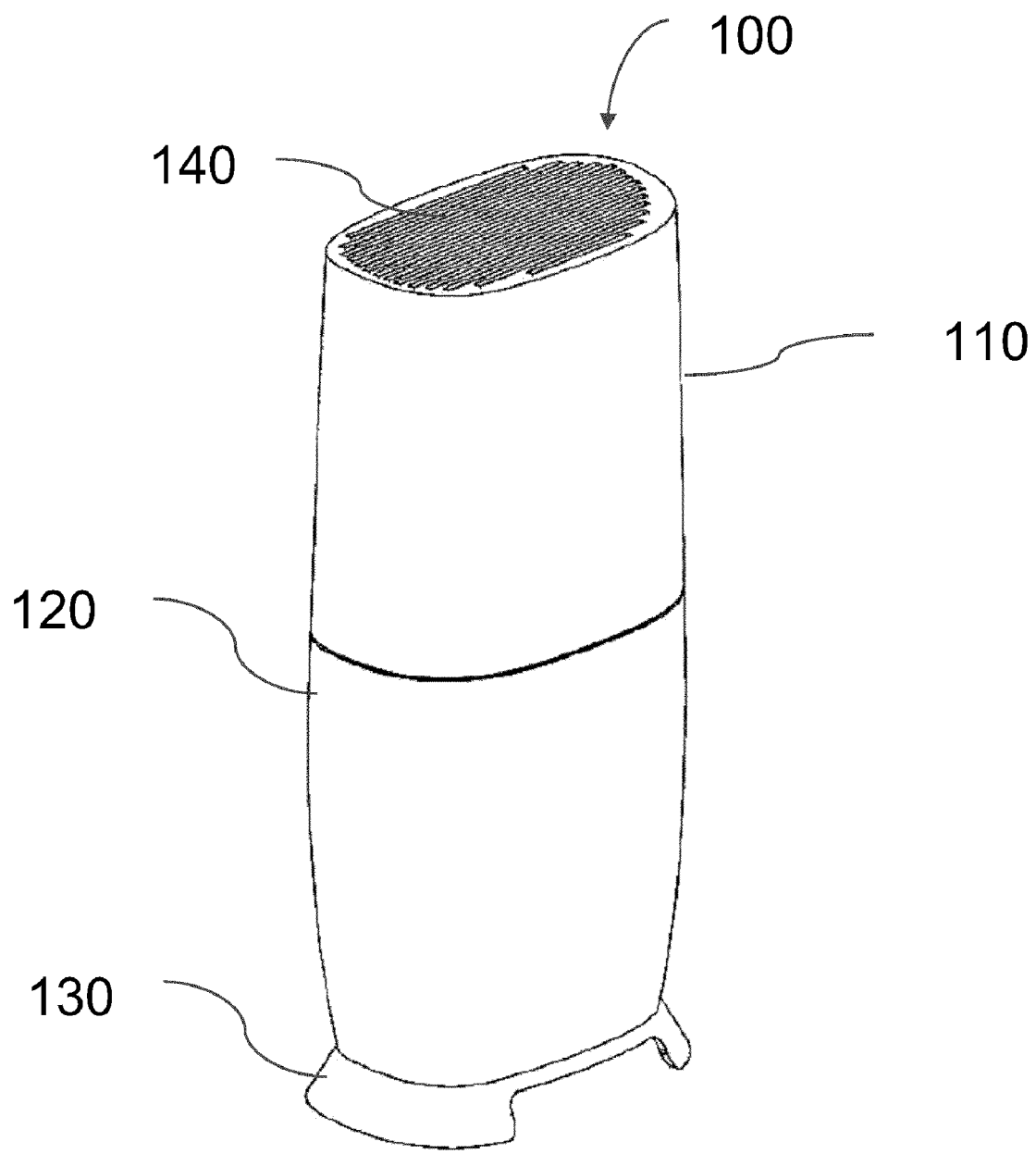
FIG. 2 is a first perspective view of a vertically oriented electronic device to which the principles of the present disclosure are applicable.

FIG. 2 shows a first perspective view of the exemplary electronic device 100. An upper vent mechanism 140 is shown included in the top surface of upper case 110. Upper vent mechanism 140 may include a plurality of parallel ribs forming a grid that has open space between them. The open space allows air to flow from inside electronic device 100 outwardly between the ribs. Other shapes may be used to form the vent mechanism 140. It is important to note that in some embodiments, the upper vent mechanism 140 may be included near the top section of one or more faces of upper case 110. In such an instance, it is advantageous that upper vent mechanism 140 be located in a position that is above any heat generation components included inside electronic device 100.

Figure 3:
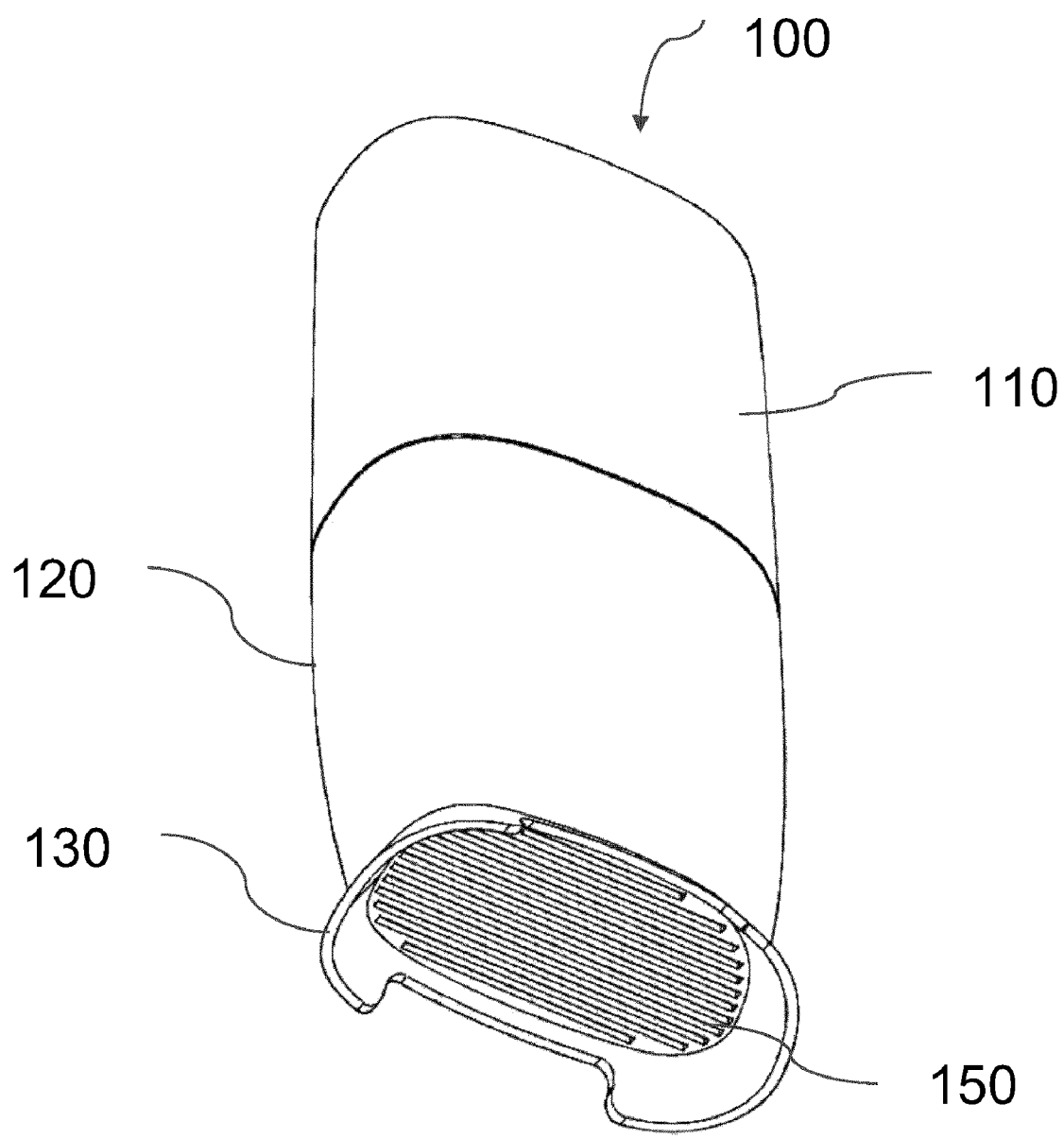
FIG. 3 is a second perspective view of a vertically oriented electronic device to which the principles of the present disclosure are applicable.

FIG. 3 shows a second perspective view of the exemplary electronic device 100. A lower vent mechanism 150 is shown included in the bottom surface of lower case 120. Lower vent mechanism 150 is similar in appearance to upper vent mechanism 140, allowing air to flow inwardly from the exterior to the interior of electronic device 100. Lower vent mechanism, along with upper vent mechanism 140 described in FIG. 2, used to form a portion of the heat management system of electronic device 100. In some embodiments, lower vent mechanism 150 may be part of base 130 and used to form the bottom face of lower case 120 when assembled. It is important to note that in some embodiments, the lower vent mechanism 150 may be included near the bottom section of one or more faces of lower case 120. In such an instance, it is advantageous that the lower vent mechanism 150 be located in a position that is below any heat generation components included inside electronic device 100.

Figure 4:
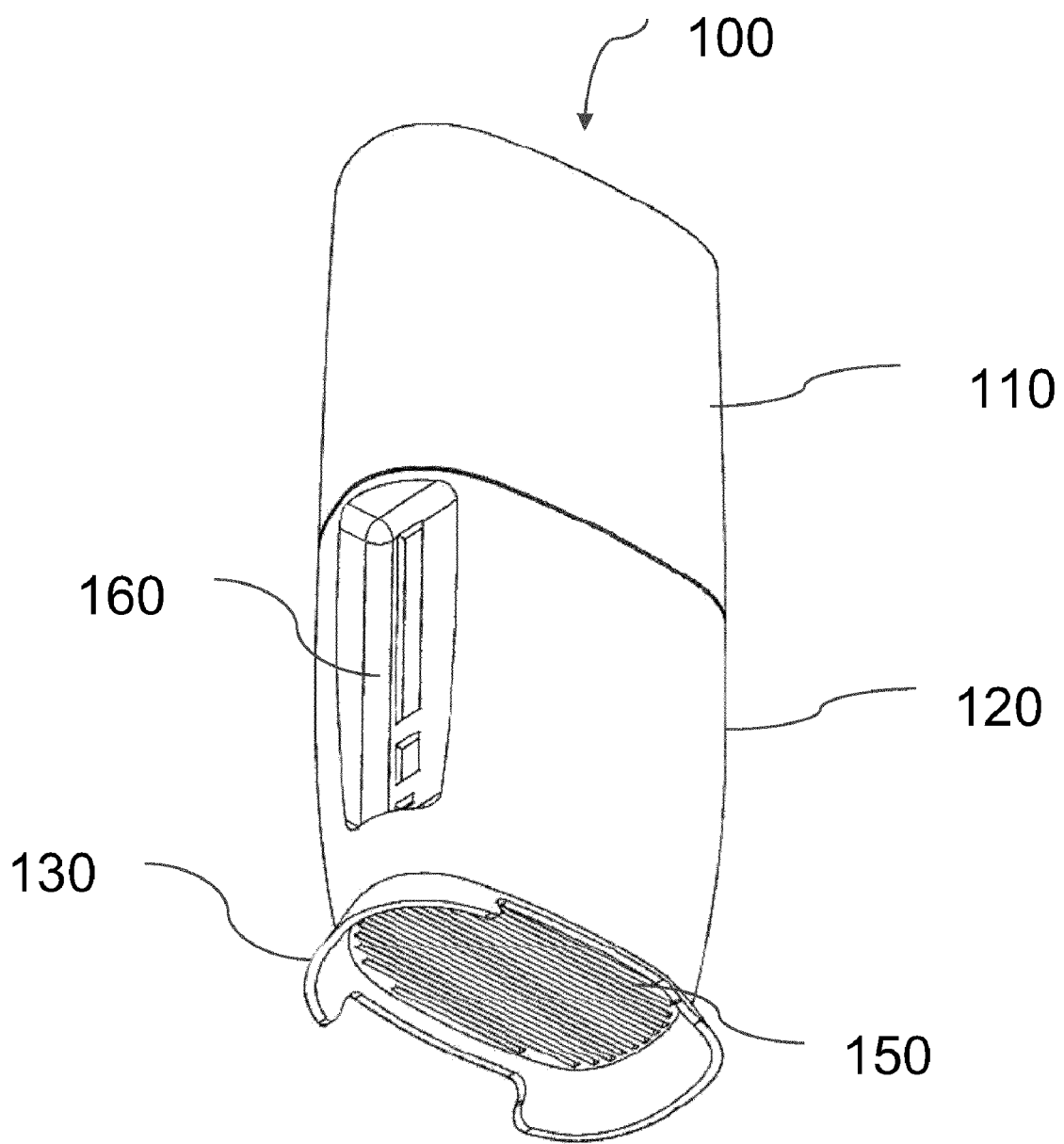
FIG. 4 is a third perspective view of a vertically oriented electronic device to which the principles of the present disclosure are applicable.

FIG. 4 shows a third perspective view of the exemplary electronic device 100. An electrical interface panel 160 is shown included on a face of lower case 120. In some embodiments, electrical interface panel 160 is located on the back face of electronic device 100. Electrical interface panel 160 may include connectors, switches, and buttons associated with the operation of electronic device 100. In some embodiments, the connectors, switches, and buttons may be mounted on a printed circuit board included as part of the electronics housed in electronic device 100 and may protrude and/or be accessible through one or more openings in lower case 120.

It should be understood that electronic device 100 contains a plurality of electronic components for proper operation. The electronic components may include but are not limited to a printed circuit board (PCB), a hard drive, a smart card assembly, a tuner, and an antenna, an integrated circuit, and the like.

Also, it is intended that expressions such as "back" and "front" and "vertical" and "horizontal," as well as other complementary terms are intended to be construed from the perspective of the observer of the figures; and as such, these expressions can be interchanged depending upon the direction from which the device is observed.

Figure 5:
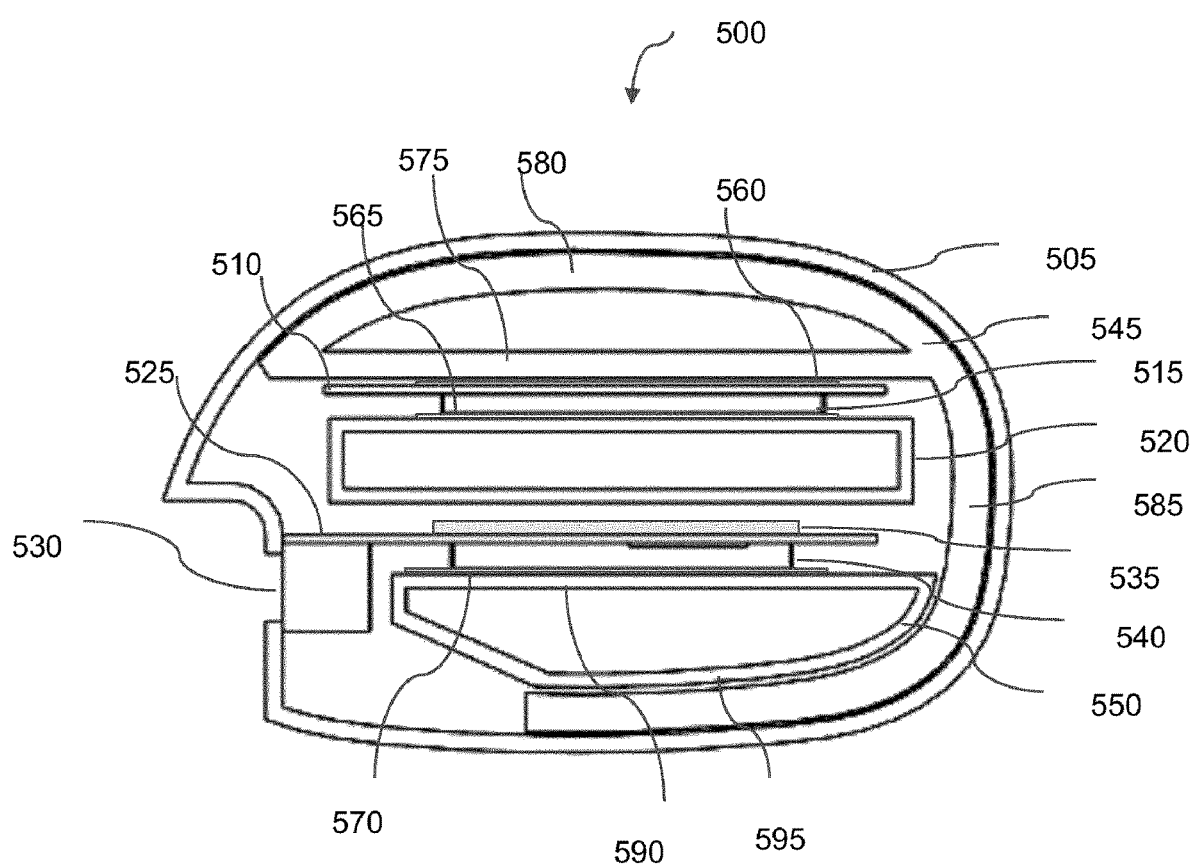
FIG. 5 is a cross-sectional view of an electronic device, taken along line 5-5 in FIG. 1 to which the principles of the present disclosure are applicable.

FIG. 5 shows a cross-sectional view 500 of an electronic device, such as electronic device 100 described in FIGS. 1-4, taken along line 5-5 in FIG. 1 according to aspects of the present embodiments. Cross sectional view 500 illustrates an exemplary internal structure contained within the case and the interface between the electronics and the heat management mechanism included in the electronic device 100. Case 505 may include a plurality of elements (e.g., upper case 110 and lower case 120 described in FIGS. 1-4) and may be made or formed from an appropriate aesthetic material, such as plastic. A first PCB 510 may include a plurality of electronic components mounted on one or both surfaces and electrically connected to a plurality of conducting traces on the surface or within layers of PCB 510. A shield structure 515 may be mounted perpendicular to one surface of PCB 510 and be electrically connected to one or more of the plurality of conducting traces on the one surface. Shield structure 515 may be formed as a frame and may surround all or a portion of the components mounted on a surface of PCB 510. Shield structure 515 may also include a lid (not shown) that is mechanically mounted to the frame of shield structure 515.

A second PCB 525 may also include a plurality of electronic components mounted on one or both surfaces and electrically connected to a plurality of conducting traces on the surface or within layers of PCB 525. A shield structure 535 may be mounted to a first surface of PCB 525 and electrically connected to one or more of the plurality of conducting traces on the first surface. An additional shield structure 540 may be mounted to a second surface of PCB 525 and electrically connected to one or more of the plurality of conducting traces on the second surface. The form and characteristics of shield structure 535 and shield structure 540 are similar to shield structure 515. One or more electrical interface components 530, such as connectors, switches, and buttons, may be mounted to and one surface of PCB 525 and electrically connected to a plurality of conducting traces on the surface or within layers of PCB 525. The one or more electrical connectors 530 may be positioned on PCB 525 such that may protrude through at least one opening in case 505 in a manner similar to electrical interface panel 160 described in FIG. 4.

PCB 510 has a heat spreader 545 coupled to one of its surfaces through a thermal interface 560. A heat spreader 545 is a type of heat sink providing heat dissipation properties and it is noted that the terms heat spreader and heat sink are often used interchangeably. Heat spreader 545 may have one or more contact areas, through thermal interface 560, to the surface of PCB 510 or to one or more heat generating electronic components on the surface of PCB 510. Heat spreader 545 may extend horizontally to span at least the horizontal width of PCB 510. Heat spreader 545 may also extend vertically to span all or a portion of the vertical height of PCB 510. Heat spreader 545 has a circumferential shape that is hollow and columnar along the vertical axis of the electronic device and is open at both ends. The opening or shape formed by heat spreader 545 may be referred to as an open-ended columnar channel. A first surface portion 575 of heat spreader 545 extends parallel along the surface to both ends of PCB 510 in a horizontal direction and extends further outward to the inner surface of case 505 of the electronic device. A second surface portion 580 of heat spreader 545 extends or wraps horizontally from one side of case 505 following or extending along the contour of a portion or section of the inner surface of case 505 and terminates at the other side of case 505 joining up to the first surface portion 575 of heat spreader 545 to form the shape around, or encompass, the open-ended columnar channel. An additional portion 585 of heat spreader 545 may be formed as an extension from the open-ended columnar channel formed by the surface portions 575 and 580. The additional portion 585 may start at the location of the intersection for the first surface portion 575 and the second surface portion 580. The additional portion 585 of heat spreader 545 is formed to follow or extend along the contour of the inner surface along a different portion of the inner surface of case 505, such as the opposite side of case 505 from the side to which the second surface portion 580 is located.

A second heat spreader 520 is coupled to a second surface of PCB 510 through a thermal interface 565. Heat spreader 520 may also have one or more contact areas to the surface, one or more electronic components or one or more shields of PCB 510, as described above. Heat spreader 520 is also formed as an open-end columnar channel, as described for heat spreader 545.

A third heat spreader 550 is coupled to a surface of PCB 525 through a thermal interface 570. Heat spreader 550 may have one or more contact areas to the surface, to one or more electronic components, or to one or more shields of PCB 525, as described above. Heat spreader 550 includes a first surface portion 590 and a second surface portion 595 to form a shape around an open-ended columnar channel similar to that described for heat spreader 545. Heat spreader 550 may extend horizontally to span all or a portion of the horizontal width of PCB 525. Heat spreader 545 may also extend vertically to span all or a portion of the vertical height of PCB 525. The first surface portion 590 of heat spreader 545 extends parallel along the surface to one end of PCB 510 in a horizontal direction and extends further outward to the inner surface of case 505 of the electronic device closest to the one end. The first surface portion 590 does not extend to the other end of PCB 510 due to the presence of the one or more electrical interface components 530. A second surface portion 595 of heat spreader 545 extends or wraps horizontally from one side of case 505 to the other side of case 505 following or extending along the contour of a portion or section of the inner surface of case 505 and joins up to the first surface portion 590 of heat spreader 550 without interfering with the one or more electrical interface components 530. It is important to note that, in some embodiments, heat spreader 520 and heat spreader 550 may be different in shape from the shape of heat spreader 545 while still maintaining the properties required to form an open-ended columnar channel.

Thermal interfaces 560, 565, and 570 may be one or more of several possible interface elements including, but not limited to, heatsink or thermal grease, pyrolytic graphite pads, sil-pads, phase change materials, thermal adhesives, and potting compounds. It is important to note that in some embodiments, one or more of the thermal interfaces 560, 565, and 570 may be used as part of the mounting or support structure for the heatsink to PCB interface or for the internal component structure.

As part of the principles of the present disclosure, the arrangement shown in cross-sectional view 500 may be referred to as a two PCB stack heat management mechanism. The arrangement and orientation of heat spreader 545, heat spreader 520, and heat spreader 550 with respect to PCB 510 and PCB 525 provides a balance of heat management for the electronic components on PCB 510 and PCB 525 inside case 505. The arrangement extracts heat from the heat generating electronic components or elements of both PCB 510 and PCB 525 and allows the heat to escape or dissipate through the open-ended columnar channel formed by heat spreaders 545, 520, and 550 by convection air flow from inlet vents located below PCB 510 and PCB 525 to outlet vents located above PCB 510 and 525. Additionally, the open-end columnar channel shape of heat spreader 545, heat spreader 520, and heat spreader 550 provide extraction of heat from PCB 510 and PCB 525 through the interior area of heat spreader 545, heat spreader 520, and heat spreader 550 as a result of convection air flow created by inlet and outlet vents include as part of case 505. In this manner, the open-ended columnar channel shape of heat spreader 545, heat spreader 520, and heat spreader 550 functions as a convective chimney. Further, the planar and circumferential shape and span of heat spreader 545 and heat spreader 550 also provide conduction of heat from the surface portion coupled to the PCB 510 and PCB 525 (e.g., first surface portion 575 and first surface portion 590) around the circumference of the heat spreader to the surface portion near the inner surface of outer case 505 (e.g., second surface portion 580 and second surface portion 595). Further, the opposing orientation of the first surface portions 575, 590 and second surface portions 590, 595 of heat spreader 545 and heat spreader 550 create a thermal reflection mechanism. For example, heat generated by electronic components of PCB 510 and PCB 525 that is conducted into the first surface portions 575 and 590 and radiated into the interior region of heat spreaders 545 and 550 will be reflected back into the interior region due to the presence of the second surface portions 580 and 595. The forming of first surface portion 575 and additional surface portion 585 of heat spreader 545 to follow the shape and extend along the inner surface of case 505 additionally provides a uniform surface temperature due to heat radiation from the heat spreaders along a substantial portion of the inner surface of case 505. The uniform surface temperature results in a decrease or elimination of undesirable hot spots that a user may contact when touching the outer surface of case 505. It is important to note that these principles may be applied in a variety of shapes and structures that utilize convective chimney principles and an open-ended columnar channel shape.

It is important to note that the size of heat spreader 545 is much larger than the size of heat spreader 550 and the size of heat spreader 520. The difference in size, as well as surface area and shape, is to account for a difference in the amount of heat generated by the electronic components for each of PCB 510 and PCB 525. In the present embodiment, the heat generated from PCB 510 is greater than the heat generated from PCB 525. In other embodiments, the heat generated may be equal or may be reversed in magnitude for PCB 510 and PCB 525. In these embodiments, the size, as well as surface area and shape, of each of the heatsinks may be adjusted according to design techniques for the heat generated as well as the space allocated within case 505 without deviating from the principles of the present disclosure. Further, in some embodiments, heat spreader 520 may additionally be coupled, through a thermal interface, to PCB 525 or may not be present as it is may not be needed as part of the thermal management mechanism.

Further, as a result of the difference in the amount of heat generated from PCB 510 being greater than PCB 525, heat spreader 545 is shown as extended to wrap around the inner surface of case 505 in the region occupied by PCB 525 and heat spreader 550. The additional surface area for heat spreader 545 allows for additional heat spreading or thermal dissipation from PCB 510 as well as a lower and more uniform surface temperature along the entire outer surface of case 505. Further, the transfer of heat generated from PCB 510 into the region occupied by PCB 525 and heat spreader 550 also provides better thermal balance between the regions occupied by PCB 525 and PCB 510. Heat spreader 550 is not coupled or connected (e.g., with a thermal interface material) to heat spreader 545.

Although heat spreader 545, heat spreader 520, and heat spreader 550 may be mechanically coupled or attached to PCB 510 and PCB 525 using only the properties of thermal interfaces 560, 565, and 570, additional attachment mechanisms may be included (not shown). These attachment mechanisms may include, but are not limited to, a screw, push pin, twist pin or screw pin. Further mechanical interfaces may be included on PCB 510 and PCB 525 as well as heat spreaders 545, 520, and 550 to accommodate the attachment mechanisms. In some embodiments, the attachment mechanism may minimize or prevent direct thermal coupling by utilizing a thermally insulated attachment mechanism and/or by eliminating copper surfaces on and through PCBs 510 and 525 under or around the attachment mechanism.

In some embodiments, a fan or blower (not shown) may be included and placed either above or below PCB 510 and PCB 525 in order to pull air or push air through the inside of case 505 and through the convection chimneys formed by heat spreader 545, heat spreader 520, and heat spreader 550. The additional air flow may further improve cooling efficiency. The fan may continuously operate or may be controlled by an electronic component and/or a sensor and operate based on a measured condition inside case 505, such as air temperature.

Figure 6A:
FIG. 6a is an exemplary heat sink or heat spreader used in an electronic device to which the principles of the present disclosure are applicable.
Figure 6B:
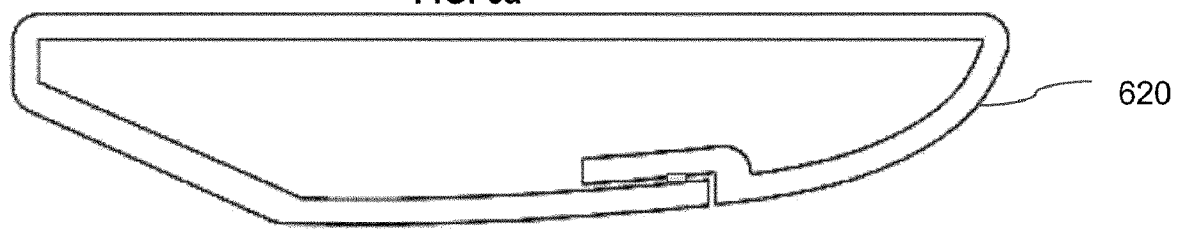
FIG. 6b is another exemplary heat sink or heat spreader used in an electronic device to which the principles of the present disclosure are applicable.
Figure 6C:
FIG. 6c is a further exemplary heat sink or heat spreader used in an electronic device to which the principles of the present disclosure are applicable.

FIGS. 6a-6c illustrate exemplary material and construction aspects for a heat sink or heat spreader, such as heat spreader 545, heat spreader 520, or heat spreader 550 described in FIG. 5, according to aspects of the present disclosure. The heat sink illustrated in FIGS. 6a-6c includes a circumferentially shaped element that is used as a convection chimney having the properties and characteristics, as described above. FIG. 6a shows a heat sink 610 constructed or formed using an extrusion or casting process with aluminum or an aluminum compound as the base material. The extrusion or casting process creates a heat sink that does not require any seams. It is important to note that if heat sink 610 is formed using a casting process, zinc or a zinc compound may also be used as the base material. The extrusion or casting process used for heat sink 610 will require a minimum defined thickness in order to avoid extrusion or casting deficiencies.

FIG. 6b shows a heat sink 620 constructed or formed from sheet aluminum using a cutting, pressing, and bending process. Heat sink 620 is constructed by cutting a planar section from the sheet aluminum that has been dimensioned to result in the desired three-dimensional shape for heat sink

620 when pressed and bent. The cut planar section is bent and pressed using one or more pressing and forming tools. In some embodiments, the closing of the convection chimney aspect of the heat sink may require one or more fastening elements or welding steps. The material properties of aluminum allow heat sink 620 to be made using thinner material than required for heat sink 610 but will still require a minimum defined thickness in order to avoid stress fracturing during the forming process.

FIG. 6c shows a heat sink 630 constructed or formed from sheet steel using a cutting, pressing, and bending process. Heat sink 630 is constructed by cutting a planar section from the sheet steel that has been dimensioned to result in the desired three-dimensional shape for heat sink 630 when pressed and bent. The cut planar section is bent and pressed using one or more pressing and forming tools. In some embodiments, the closing of the convection chimney aspect of the heat sink may require one or more fastening elements or welding steps. The material properties of sheet steel allows heat sink 630 to be made using thinner material than required for heat sink 620 and heat sink 610 with less risk of stress fracturing during forming. In some embodiments, the sheet steel may be pre-plated or post-plated after forming in any one of the conventional plating manners known to those skilled in the art. It is important to note that heat sinks may be made using other suitable materials and formed using other suitable process as are well known to those skilled in the art.

Figure 7A:
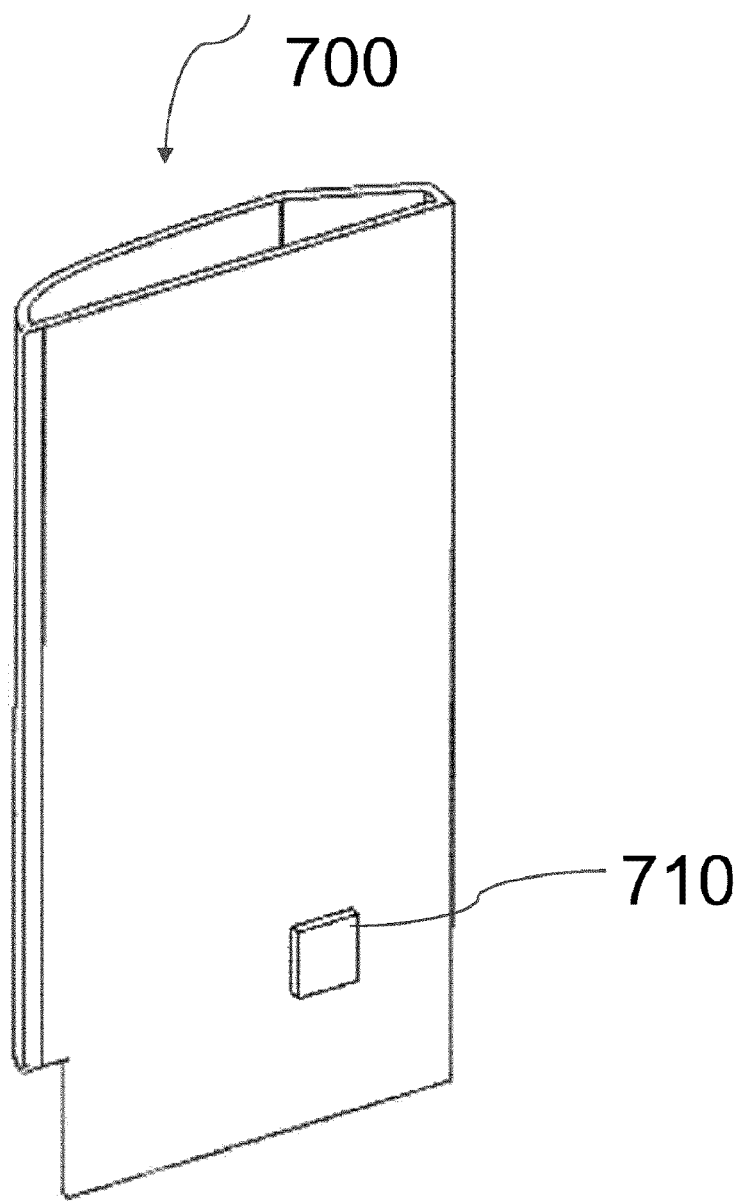
FIG. 7a is an exemplary heat sink or heat spreader including an electronic component interface feature used in an electronic device to which the principles of the present disclosure are applicable.
Figure 7:
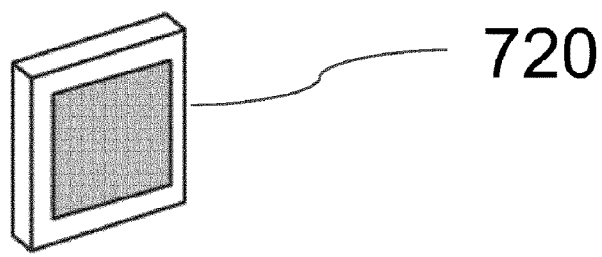
FIG. 7b is an exemplary spacer used with a heat sink or heat spreader used in an electronic device to which the principles of the present disclosure are applicable.

FIG. 7a illustrates a heatsink or heat spreader 700, similar to heat spreader 545, heat spreader 520, or heat spreader 550 described in FIG. 5, including an electronic component interface feature according to aspects of the present disclosure. Heatsink 700 includes a protrusion element 710 that facilitates surface contacting interface to an electronic component, such as an integrated circuit, a portion of a shield, or an area on the surface of a PCB. In some embodiments, the protrusion element 710 may be formed or pressed as part of heatsink 700. The forming process may depend on the type of material used and/or the process used for forming the heatsink. For example, if sheet steel is used, as described for heat sink 630 in FIG. 6c, protrusion element 710 may be formed into the sheet steel when the heatsink is formed. In another example, if aluminum is used as part of an extrusion or casting process, a separate spacer may be formed to be used as protrusion element 710 and attached to the heatsink using an adhesive, such as a thermally conductive adhesive. An example spacer 720 that may be used as a protrusion element, such as protrusion element 710, is shown in FIG. 7b.

Figure 8A:
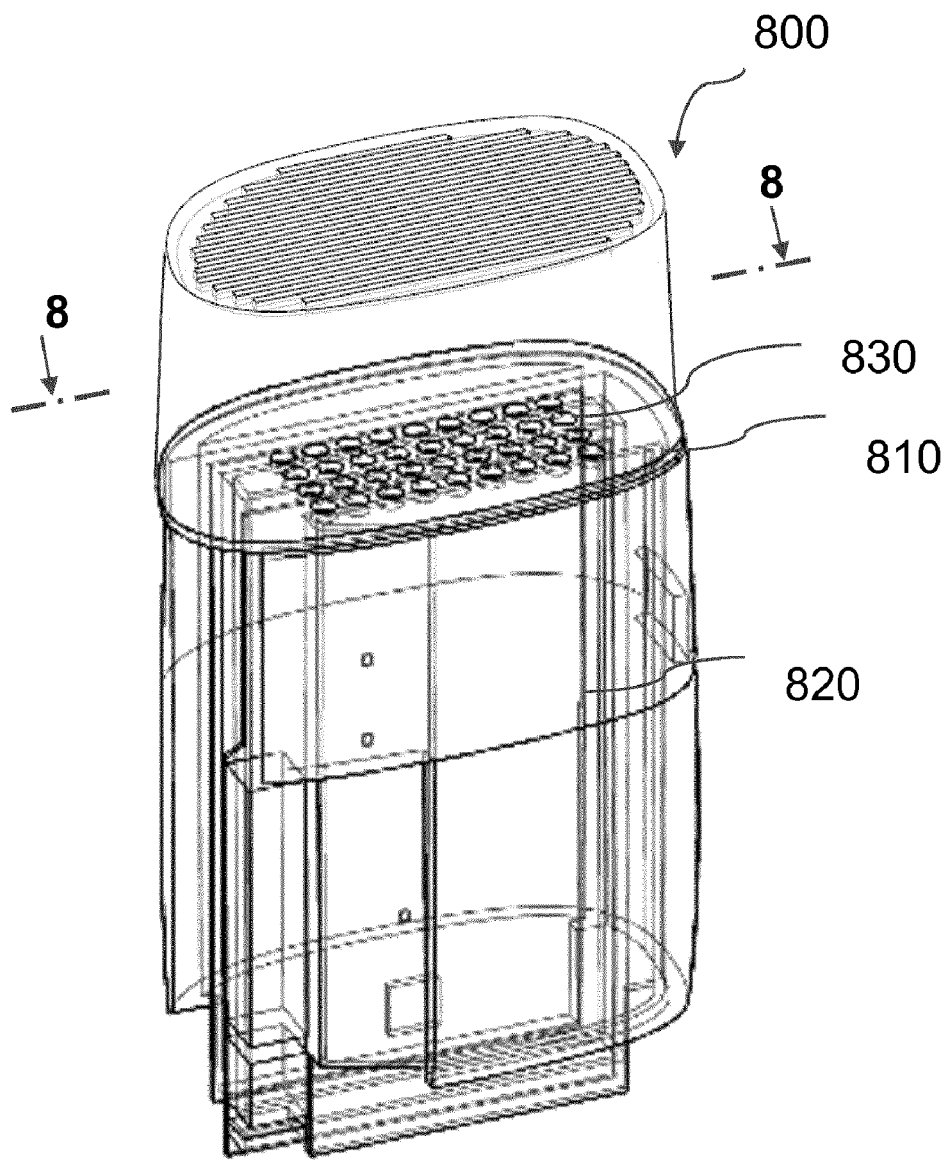
FIG. 8a is a perspective view of an electronic device illustrating the internal components including a baffle element to which the principles of the present disclosure are applicable.
Figure 8B:
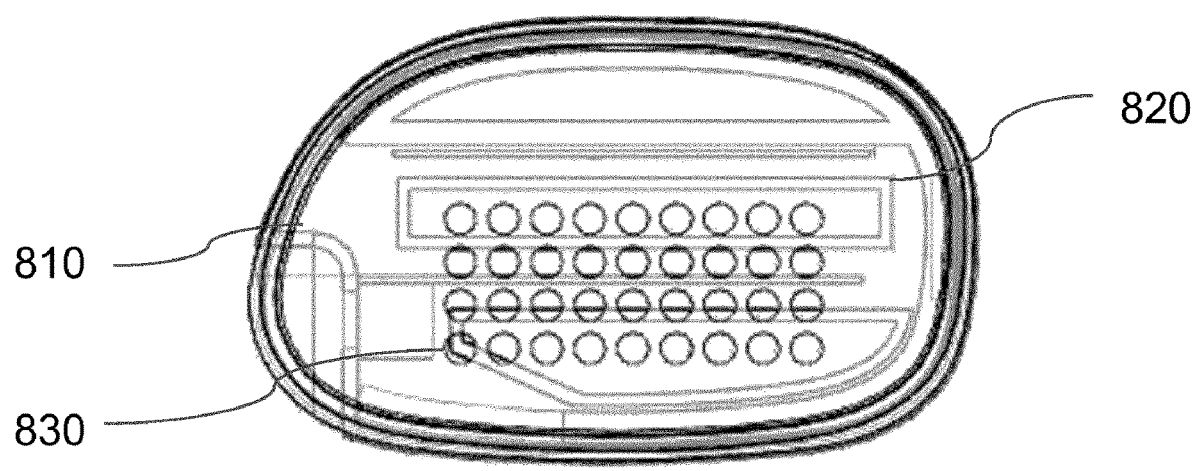
FIG. 8b is a cross-sectional view of an electronic device, taken along line 8-8 in FIG. 8a, illustrating a baffle element to which the principles of the present disclosure are applicable.

FIGS. 8a-8b illustrate an exemplary electronic device 800, similar to electronic device 100 described above, incorporating aspects of a heat management system according to the present embodiments. FIG. 8a is a perspective view perspective showing the elements internal to electronic device 800. FIG. 8b is a cross-sectional view of electronic device 800, taken along line marked 8-8 in FIG. 8a.

Electronic device 800 includes a baffle element 810 and an internal component stack 820. Baffle element 810 is located internal to the case of electronic device 800 in a space between the upper surface of the electronic device and the internal component stack 820. Internal component stack 820 may include one or more PCBs and associated thermal components, such as PCB 510 and PCB 525 and associated heat spreaders described in FIG. 5. In one embodiment, baffle element 810 is located at the top plane of, and perpendicular to, internal component stack 820 and spans the distance across the inner surfaces of the electronic device. Baffles element 810 acts as a thermal barrier for air flow management inside of the electronic device. The upward flow of air is controlled through one or more openings or vents 830 in baffle element 810. The one or more openings or vents 830 may be formed as holes, slots, or any other suitable type of opening. The one or more openings or vents 830 may be positioned in specified or predetermined locations along the planar surface of baffle element 810. The locations may be chosen based on empirical data gathered as part of design criteria for the electronic device. In some embodiments, the vent openings may be adjustable either during assembly of the electronic device or during operation of the electronic device.

Figure 9:
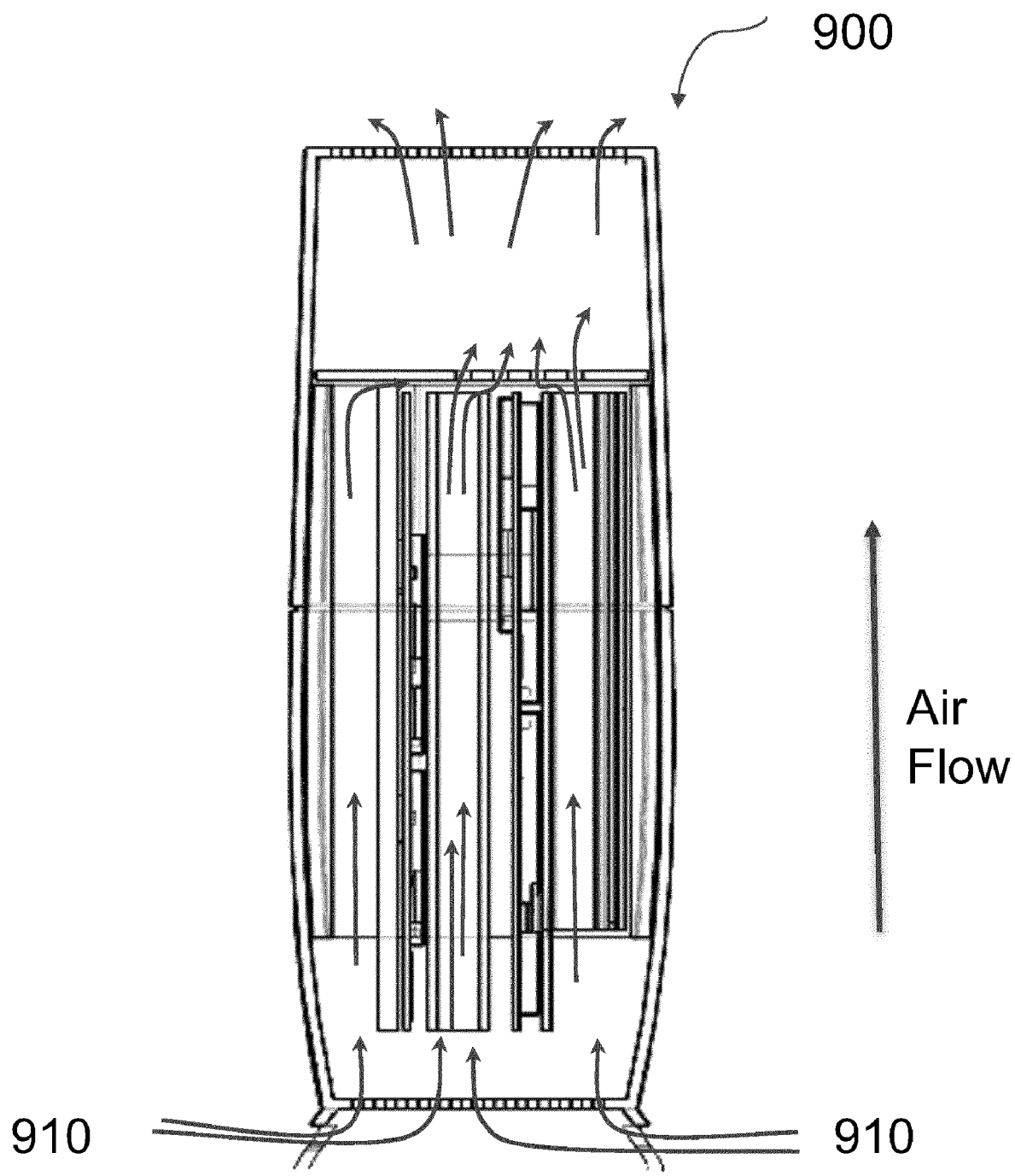
FIG. 9 is a cross-sectional view of an electronic device, taken along line 9-9 in FIG. 1, showing air flow through the electronic device to which the principles of the present disclosure are applicable.

FIG. 9 shows a cross-sectional view of an electronic device 900, similar to electronic device 100 described in FIGS. 1-4, taken along a line marked 9-9 according to aspects of the present embodiments. The cross sectional view of electronic device 900 provides a representation of the air flow control associated with the heat management system according to aspects of the present disclosure. Air flow lines 910 illustrate a flow of air upward through electronic device 900. External air enters through vents in the bottom of electronic device 900 (e.g., through lower vent mechanism 150 described above), flowing through the internal component stack and across the heatsinks, passing through, in an intentionally controlled manner, openings in a baffle, such as baffle element 810 described in FIG. 8. The air flow that passes through the openings in the baffle further flows out of the top of electronic device 900 (e.g., through upper vent mechanism 140 described above). The baffle provides an air flow restriction to control the rate of air flow through electronic device 900 and maintains a certain volume of air in the space occupied by the internal component stack in electronic device 900 as part of the heat management system.

Figure 10:
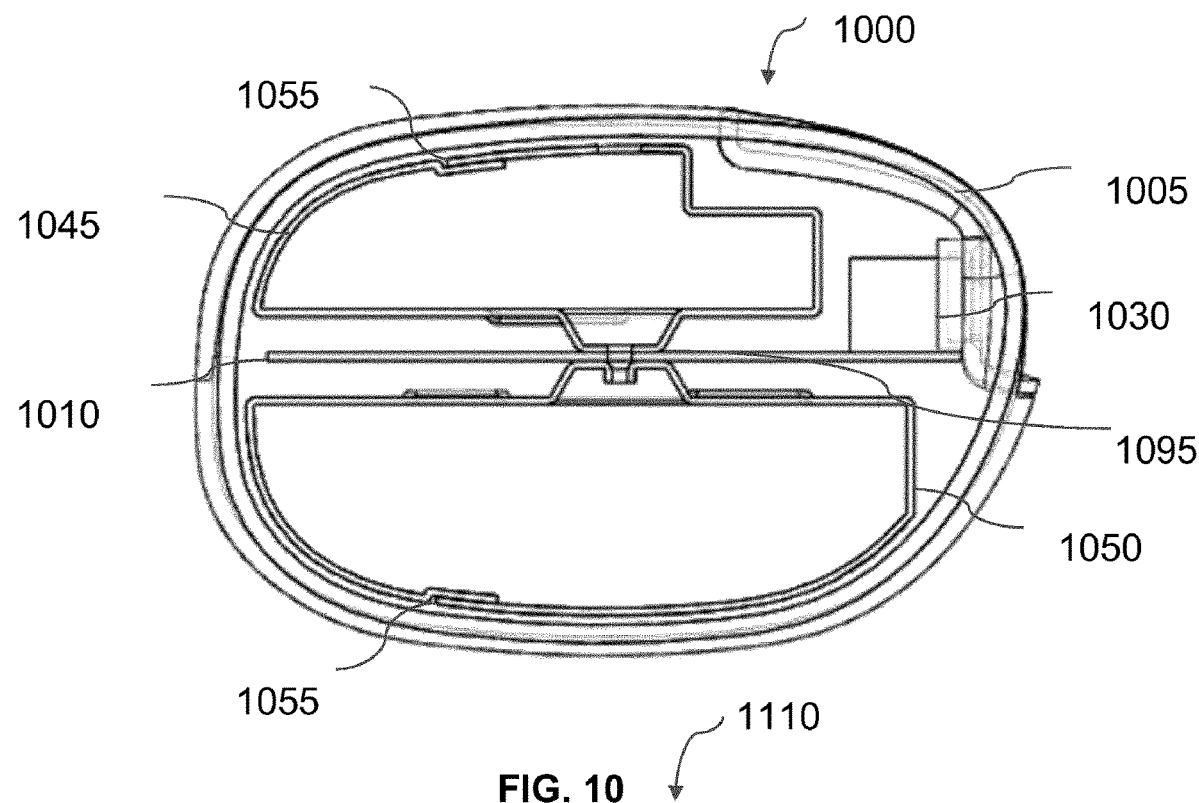
FIG. 10 is a cross-sectional view of another exemplary internal structure contained within the case of an electronic device, taken along line 5-5 in FIG. 1, to which the principles of the present disclosure are applicable.

FIG. 10 is a cross-sectional view of an electronic device 1000, similar to electronic device 100 described in FIGS. 1-4, taken along line 5-5 in FIG. 1 according to aspects of the present disclosure. Cross-sectional view 1000 illustrates another exemplary internal structure contained within the case and the interface between the electronics and the heat management mechanism included in electronic device 1000. Case 1005 may include a plurality of elements (e.g., an upper case 110 and a lower case 120 as described above) and may be made or formed from an appropriate aesthetic material, such as plastic. A PCB 1010 may include a plurality of electronic components mounted on one or both surfaces and electrically connected to a plurality of conducting traces on the surface or within layers, as described above in FIG. 5. A shield structure (not shown) may be mounted to one or both surfaces of PCB 1010 and formed as well as electrically connected to one or more of the plurality of conducting traces on the surfaces of PCB 1010, as described above.

A first heat sink 1045 is coupled to a first one of the surfaces of PCB 1010. Heat sink 1045 may have one or more contact areas, through thermal interfaces (not shown), to the surface of PCB 1010, to metal shields (not shown) mounted to the surface of PCB 1010, or to one or more heat generating electronic components (not shown) on the surface of PCB 1010, as described above. Heat sink 1045 has a circumferential shape to form an open-ended columnar channel similar to heat spreader 545 described in FIG. 5. The outer portion of heat sink 1045, away from PCB 1010, extends around following or extending along the contour of the inner surface of case 1005, as described above.

A second heat sink 1050 is coupled to a second surface of PCB 1010. Heat sink 1050 may have one or more contact areas, through thermal interfaces (not shown), to the surface, one or more electronic components, or one or more shields (not shown) mounted on PCB 1010, as described above. Heat sink 1050 also has a circumferential shape forming an open-ended columnar channel, as described above for heat spreader 550. As with heat sink 1045, the outer portion, away from PCB 1010, wraps around following the contour of the inner surface of case 1005, as described above. In cross-section 1000, heat sink 1045 is thermally coupled to electronic components, shields, or the surface of one side of PCB 1010 while heat sink 150 is thermally coupled to the electronic components, shields, or the surface of another or second side of PCB 1010. Further, the outer portion of heat sink 1050 extends along the contour of the inner surface on an opposite inner surface of case 1005 from the outer portion of heat sink 1045. In some embodiments, heat sink 1045 and heat sink 1050 may have some overlap and further may be directly thermally coupled. It is important to note that heat sink 1045 and heat sink 1050 are shown as formed from sheet steel and include seam sections 1055. In some embodiments, other materials and other formation processes may be used, as described above.

An attachment interface 1095 is shown to mechanically couple heat sink 1045 and heat sink 1050 to PCB 1010. In some embodiments, more than one attachment interface 1095 may be included. Further, in some embodiments, the mechanical coupling of attachment interface 1095 may not provide direct thermal coupling, by utilizing a thermally insulated attachment mechanism (e.g., an insulated screw, push pin, twist pin or screw pin) and by eliminating copper surfaces on and through PCB 1010 under attachment interface 1095.

As part of the principles of the present disclosure, the arrangement shown in FIG. 10 may be referred to as a single PCB stack heat management mechanism. The arrangement and orientation of heat sink 1045 and heat sink 1050 with respect to PCB 1010 provides balanced heat management. The arrangement extracts heat from the electronic components on both sides of PCB 1010 and allows the heat to escape or dissipate through the open-ended columnar channel formed by heat sinks 1045 and 1050 by convection air flow from inlet vents located below PCB 1010 to outlet vents located above PCB 1010, as described above. Further, the planar and circumferential shape and span of heat sink 1045 and heat sink 1050 also provide conduction of heat from the electronic components, shields, and surfaces of both sides of PCB 1010 circumferentially around the surface to the portions of heat sinks 1045 and 1050 near the inner surface of outer case 1005, as described above. Further, the open-ended columnar channel shape creates a thermal reflection mechanism into the interior region of heat sinks 1045 and 1050, as described above. The forming of the outer portions of heat sinks 1045 and 1050 to extend along the shape and contours of the inner surface of case 1005 additionally provides uniform heat radiation along a substantial portion of the inner surface of case 1005 to prevent undesirable hot spots that a user may contact when touching the outer surface of case 1005, as described above.

It is important to note that the size, in terms of surface area as well as area encompassed by the structure of heat spreader 1050 is larger than the size of heat spreader 1045. The difference in size may be based on empirical data indicating that the heat generated from the lower surface of PCB 1010, interfaced to heat sink 1050, is greater than the heat generated by the upper surface of PCB 1010. In other embodiments, the heat generated may be more equal or may be reversed in magnitude for the two PCBs. In these embodiments, the size, as well as surface area and shape, of each of the heatsinks may be adjusted accordingly without deviating from the principles of the present disclosure. In other embodiments, heat spreader 1050 may include a portion that extends or wraps further around the inner surface of case 1005 overlapping but not thermally contacting heat sink 1045 in a manner similar to that described in FIG. 5.

It is important to note that the principles of the present embodiments relating to heat management may be applied to other devices that include electronic circuits that may be classified as heat generating structures or elements, particularly to other devices that are vertically oriented. Such devices may include, but are not limited to, hard disk drives such disk drive arrays, optical drives, processor-based server racks, and the like. For example, a first heat sink, similar to heat sink 1045, or heat spreader 545 described in FIG. 5, may be thermally coupled to a first planar surface of the heat generating structure in the device. A second heat sink, similar to heat sink 1050, or heat spreader 550 described in FIG. 5, may be thermally coupled to a second planar surface of the heat generating structure in the device. The outer portions of the two heat sinks may follow or extend along the contour of the inner surface of the enclosure or case surrounding the heat generating structure and/or forming the outside surface of the device. Other possible configurations for heat management mechanisms in similar devices as described in the present embodiments, including those described in FIG. 5, may also be used.

In some embodiments, a fan or blower (not shown) may be included and placed either at the top of case 1005 above PCB 1010 or at the bottom of case 1005 below PCB 1010. The fan may pull air or push air through the inside of case 1005 and through the convection chimneys in heat spreader 1045 and heat spreader 1050 to improve cooling efficiency. The fan may continuously operate or may be controlled by an electronic component and/or a sensor and operate based on a measured condition inside case 1005, such as air temperature.

Figure 11A:
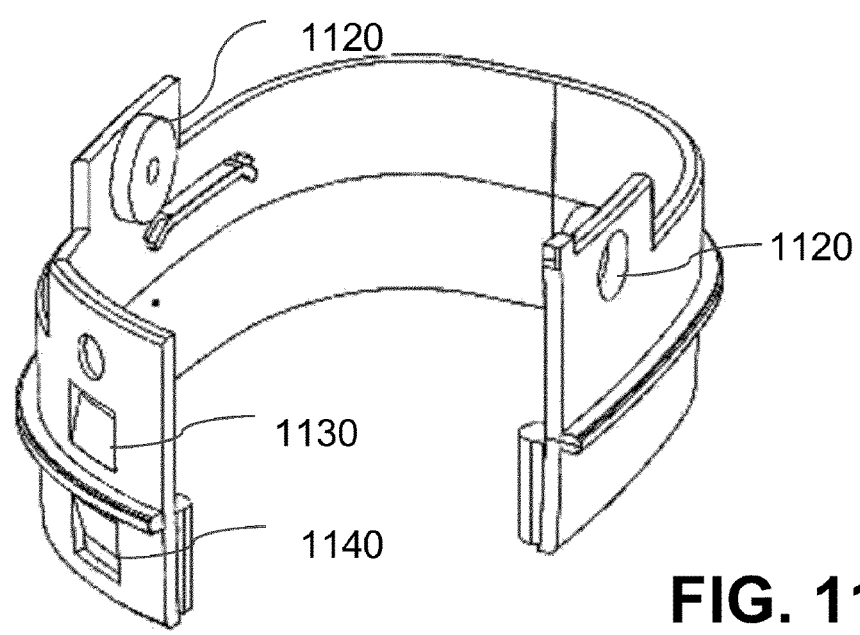
FIG. 11a is an exemplary attachment ring for an internal structure contained within the case of an electronic device to which the principles of the present disclosure are applicable.

FIG. 11*a* illustrates an exemplary attachment or mounting ring 1110 used in conjunction with a mechanical assembly as part of an electronic device, such as electronic device 100 described earlier, according to aspects of the present disclosure. Mounting ring 1110 is used as a mounting bracket for the internal component stack, such as the two PCB stack heat management mechanism described in FIG. 5 or the single PCB stack heat management mechanism described in FIG. 10. Attachment or mounting ring 1110 includes mounting holes 1120 for attaching the mounting ring to the internal component stack. Mounting ring 1100 also includes upper retainer clip 1130 and lower retainer clip 1140 for securing amounting ring 1110 to the case (e.g., upper case 110 and lower case 120 described earlier) of the electronic device. It is important to note that mounting ring 1110 may be a complete or closed ring or may include a gap or space along its circumference, referred to as an open ring.

Figure 11B:
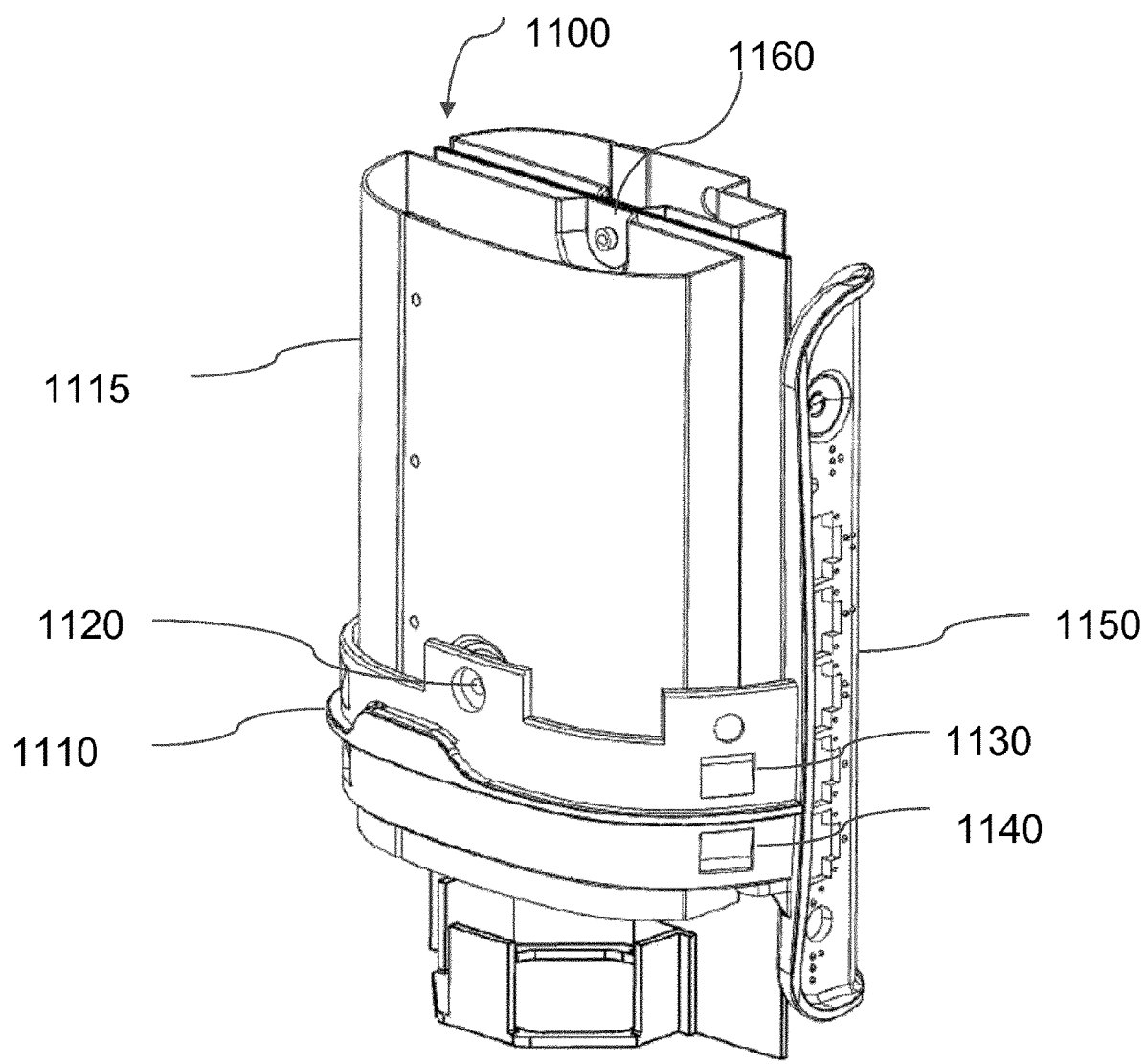
FIG. 11b is an exemplary mechanical assembly including an attachment ring and internal structure for mounting in a case of an electronic device to which the principles of the present disclosure are applicable.

FIG. 11*b* illustrates a mechanical assembly 1100 used as part of an electronic device, such as electronic device 100 described earlier, according to the principles of the present disclosure. Mechanical assembly 1100 includes mounting ring 1110, as described in FIG. 11*a*, attached to internal component stack 1115. Internal component stack 1115 also includes electrical interface panel 1150 similar to the interface panels described above positioned to span the gap in the circumference of mounting ring 1110. Internal component stack 1115 is illustrated as a one PCB stack heat management mechanism including internal mounting element 1160. In other embodiments, different component stacks, such as the two PCB stack heat management mechanism described above, may be used. Mounting ring 1110 is attached to internal component stack 1115 using a fastener through mounting hole 1120. The fastener may be any suitable type of attachment component including, but not limited to, a screw, a bolt, a rivet, and a push pin.

Figure 12:
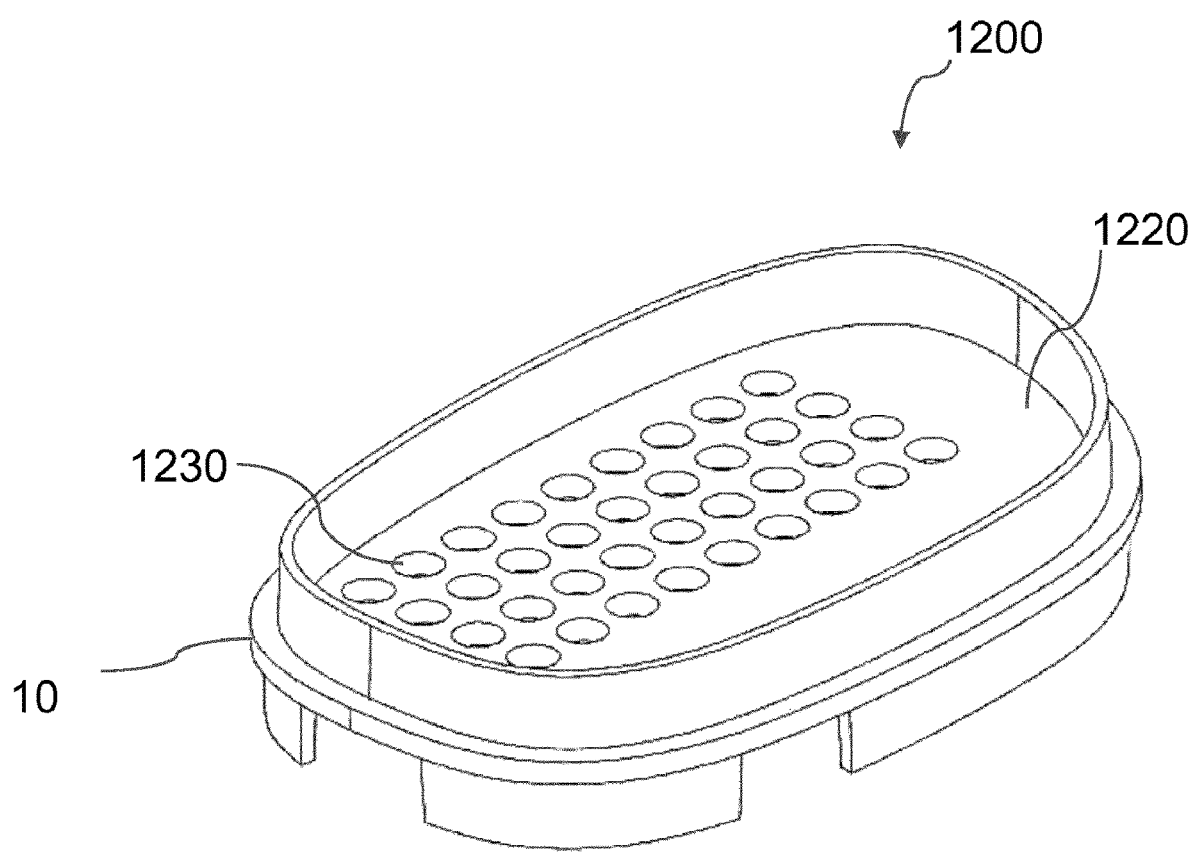
FIG. 12 is an exemplary baffle structure for mounting in a case of an electronic device to which the principles of the present disclosure are applicable.

FIG. 12 show another exemplary baffle structure 1200 as part of an electronic device, such as electronic device 100 described above, according to the principles of the present disclosure. Baffle structure 1200 includes an outer ring 1210 for coupling and/or attaching to the case of the electronic device in a manner similar to attachment or mounting ring 1110 described above. Baffle structure 1200 also includes a baffle plate 1220 located perpendicular to and internal in the space within outer ring 1210. Baffle structure 1200 may be located in a planar position in the case of the electronic device above the internal component structure or PCB stack in a manner similar to the baffle element 810 described above. Baffle structure 1200 also includes one or more openings or vents 1230 on baffle plate 1220 to control airflow in a manner similar to that described above. The locations for the openings or vents 1230 may be chosen based on empirical data gathered as part of design criteria for the electronic device. In some embodiments, the vent openings may be adjustable either during assembly of the electronic device or during operation of the electronic device. Mounting ring 1210 may also include one or more retainer mechanisms (not shown) for attaching to one or more portions of the case of the electronic device.

Figure 13:
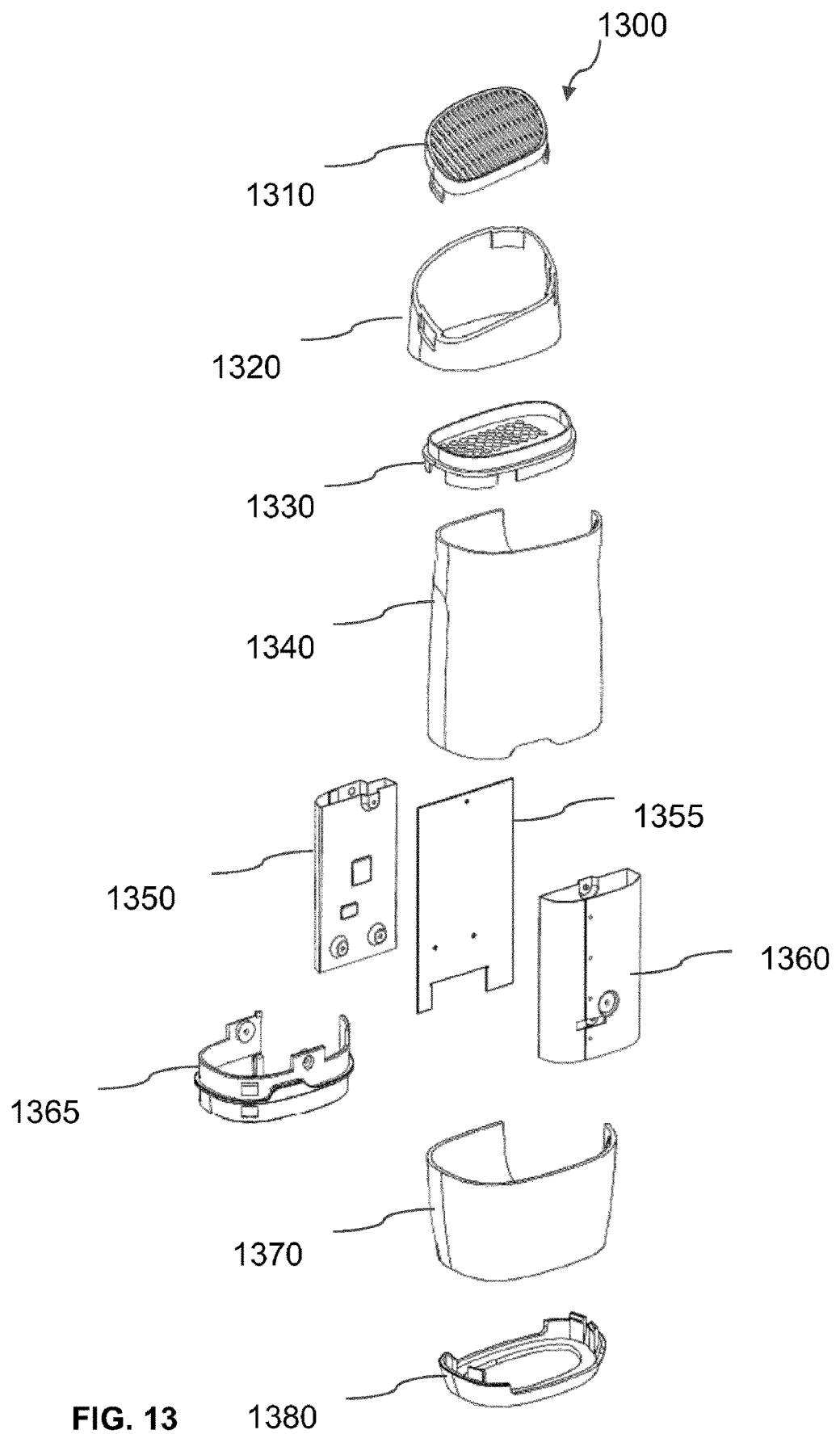
FIG. 13 is an exploded view of a set of exemplary components used as part of assembling an electronic device to which the principles of the present disclosure are applicable.

FIG. 13 shows an exemplary exploded view of the assembly components for an electronic device 1300, similar to electronic device 100 described above, according to aspects of the present disclosure. An upper vent 1310, similar to upper vent mechanism 140 described in FIG. 2, mounts or is attached to case extension 1320. A baffle structure 1330, similar to baffle structure 1200 described in FIG. 12, mounts or is attached between case extension 1320 and upper case 1340, which is similar to upper case 110 described in FIG. 1. Heat sink or heat spreader 1350 and heat sink or heat spreader 1360 mount to or are attached to PCB 1355 in a manner similar to the single PCB heat management mechanism described in FIG. 10. A retainer ring 1365, which is similar to mounting ring 1110 described in FIG. 11*a*, attaches to the assembly formed by heat sink or heat spreader 1350, heat sink or heat spreader 1360, and PCB 1355 to form a mechanical assembly similar to mechanical assembly 1100 described in FIG. 11*b*. The mechanical assembly is affixed in a position internal to and within upper case 1340 and lower case 1370 using mounting or attachment ring 1365 between upper case 1340 and lower case 1370. Lower case 1370 is similar to lower case 120 described in FIG. 1. A base 1380, which is similar to base 130 described in FIG. 1, mounts or is attached to lower case 1370. Either one or bother of lower case 1370 and base 1380 may include one or more vent openings similar to lower vent mechanism 150 described in FIG. 3.

One or more embodiments of the present disclosure provide a heat management mechanism for an electronic device. The heat management mechanism includes a heat dissipation structure that is particularly suited for vertically oriented electronic devices. The heat dissipation structure includes one or more heat sinks, or heat spreaders, coupled to electronic components mounted on printed circuit boards or to other heat generating electronic elements or structures. The heat sinks, or heat spreaders, form open-ended columnar channels that allow air to pass through the open inner regions of the heat sinks or heat spreaders. The heat sinks or heat spreaders operate as convective chimneys by allowing air flow upward from the bottom of the case of the electronic device below the heat generating electronic element or structure, such as electronic components on a printed circuit board, through to the top of the of the case. The arrangement and construction of the printed circuit boards or other heat generating electronic structures and the heat sinks or heat spreaders additionally provide an efficient assembly mechanism by simply stacking a set of coupled components that support and provide stability for the printed circuit board and heat sink or heat spreader assembly within the case of the electronic device.

According to the present disclosure, an apparatus is described that includes an outer casing enclosing a plurality of electronic components included on at least one printed circuit board, the outer casing having an inner surface and an outer surface. The apparatus further includes a heat dissipation structure coupled to the at least one printed circuit board, the heat dissipation structure forming an open-ended columnar channel, the open-ended columnar channel allowing air to flow within the heat dissipation structure in a direction parallel to the at least one printed circuit board.

In some embodiments, the heat dissipation structure includes a first heat spreader, the first heat spreader having a first portion extending in a direction parallel to a portion of the at least one printed circuit board and being thermally coupled to one of the plurality of electronic components mounted on the portion of the at least one printed circuit board, the first heat spreader also having a second portion extending along a contour of a first portion of the inner surface of the outer casing and opposite the first portion, the first portion and second portion forming the open-ended columnar channel.

In some embodiments, the heat dissipation structure further includes a second heat spreader, the second heat spreader having a first portion extending in a direction parallel to at least a different portion of the at least one printed circuit board and being thermally coupled to one of the plurality of electronic components mounted on the different portion of the at least one printed circuit board, the second heat spreader also having a second portion extending along a contour of a second portion of the inner surface of the outer casing and opposite the first portion of the additional open-ended columnar channel, the second portion of the inner surface being different from the first portion of the inner surface, the first portion and the second portion of the second heat spreader forming an additional open-ended columnar channel.

In some embodiments, the first heat spreader includes an additional portion mechanically coupled to at least one of the first portion and the second portion of the first heat spreader, the additional portion further extending along a contour of the second portion of the inner surface of the outer casing.

In some embodiments, the at least one printed circuit board is two circuit boards and wherein the first heat spreader dissipates heat generated by electronic components on a first printed circuit board and the second heat spreader dissipates heat generated by electronic components on a second printed circuit board.

In some embodiments, the first heat spreader and the second heat spreader are not thermally coupled to each other.

In some embodiments, the second portion of the first heat spreader extends along the contour of the portion of the inner surface to maintain even temperature of the outer surface of the outer casing.

In some embodiments, the apparatus further includes a baffle element enclosed by the outer casing and perpendicular to an opening in the heat dissipation structure, the baffle element located beyond one end of the printed circuit board, the baffle element including at least one opening for control of airflow through the heat dissipation structure.

In some embodiments, the outer casing further includes a first vent structure located beyond a first end of the printed circuit and a second vent structure located beyond a second end of the printed circuit board.

In some embodiments, the at least one printed circuit board is vertically oriented and is parallel to the inner surface of the outer casing.

In some embodiments, the apparatus further includes a mounting ring that is mechanically attached to the heat dissipation structure, the mounting ring mounting between a first portion of the outer casing and a second portion of the outer casing, the mounting ring providing secure positioning of the heat dissipation structure within the outer casing.

In some embodiments, the heat dissipation structure is formed as part of a casting process using zinc or aluminum or as part of a sheet bending process using aluminum or steel.

According to the present disclosure, a heat management device includes a heat dissipation structure thermally coupled to a heat generating electronic structure, the heat dissipation structure forming an open-ended columnar channel, the open-ended columnar channel allowing air to flow within the heat dissipation structure in a direction parallel to a planar surface of the heat generating electronic structure.

In some embodiments, the open-ended columnar channel includes a first portion extending in a direction parallel to the at least a portion of the at least one printed circuit board and being thermally coupled to one or more of a plurality of electronic components mounted on the portion of the at least one printed circuit board, and wherein the open-end columnar channel further includes a second portion extending along a contour of a first portion of the inner surface of an enclosure and opposite the first portion.

In some embodiments, the heat dissipation structure includes a first heat spreader, the first heat spreader having a first portion extending in a direction parallel to the planar surface of the heat generating structure and being thermally coupled to at least a portion of the planar surface of the heat generating structure, the first heat spreader also having a second portion extending along a contour of a first portion of the inner surface of an enclosure for the heat management device and opposite the first portion, the first portion and second portion forming the open-ended columnar channel.

In some embodiments, the heat dissipation structure further includes a second heat spreader, the second heat spreader having a first portion extending in a direction parallel to a different planar surface of the heat generating structure and being thermally coupled to at least a portion of the different planar surface of the heat generating structure, the second heat spreader also having a second portion extending along a contour of a second portion of the inner surface of the enclosure and opposite the first portion of the additional open-ended columnar channel, the second portion of the inner surface being different from the first portion of the inner surface, the first portion and the second portion of the second heat spreader forming an additional open-ended columnar channel.

In some embodiments, the first heat spreader includes an additional portion mechanically coupled to at least one of the first portion and the second portion of the first heat spreader, the additional portion further extending along a contour of the second portion of the inner surface of the enclosure.

In some embodiments, the heat generating structure is a printed circuit board and wherein the first heat spreader dissipates heat generated by electronic components on a first surface of the printed circuit board and the second heat spreader dissipates heat generated by electronic components on a second surface of the printed circuit board.

In some embodiments, the first heat spreader and the second heat spreader are not thermally coupled to each other.

In some embodiments, the heat management device further includes a mounting ring that is mechanically attached to the heat dissipation structure, the mounting ring providing secure positioning of the heat dissipation structure within the enclosure for the heat management device.

It is important to note that the embodiments described herein are not necessarily intended to include mutually exclusive features or aspects of the principles of the present disclosure. Unless as otherwise indicated, any embodiments described herein or contemplated as a result of using the principles of the present disclosure may include any combination of the features described in any of the above embodiments.

Although embodiments which incorporate the teachings of the present disclosure have been shown and described in detail herein, those skilled in the art can readily devise many other varied embodiments that still incorporate these teachings. Having described preferred embodiments of an apparatus for heat management in an electronic device (which are intended to be illustrative and not limiting), it is noted that modifications and variations can be made by persons skilled in the art in light of the above teachings. It is, therefore, to be understood that changes may be made in the particular embodiments of the disclosure disclosed which are within the scope of the disclosure as outlined by the appended claims.

What is claimed is:

1. An apparatus comprising:
an outer casing enclosing a plurality of heat generating electronic components included on at least one printed circuit board, the outer casing having an inner surface and an outer surface; and
a heat dissipation structure coupled to the at least one printed circuit board, the heat dissipation structure forming an open-ended columnar channel, the open-ended columnar channel allowing air to flow within the heat dissipation structure in a direction parallel to the at least one printed circuit board;
wherein the heat dissipation structure includes a first heat spreader, the first heat spreader having a first portion extending in a direction parallel to a portion of the at least one printed circuit board and being thermally coupled to one of the plurality of electronic components mounted on the portion of the at least one printed circuit board, the first heat spreader also having a second portion extending along a contour of a first portion of the inner surface of the outer casing and opposite the first portion, the first portion and second portion forming the open-ended columnar channel, the second portion of the first heat spreader extending along the contour of the portion of the inner surface to maintain even temperature of the outer surface of the outer casing.

2. The apparatus of claim 1, wherein the heat dissipation structure further includes a second heat spreader, the second heat spreader having a first portion extending in a direction parallel to at least a different portion of the at least one printed circuit board and being thermally coupled to one of the plurality of electronic components mounted on the different portion of the at least one printed circuit board, the second heat spreader also having a second portion extending along a contour of a second portion of the inner surface of the outer casing and opposite the first portion of the inner surface of the outer casing, the second portion of the inner surface being different from the first portion of the inner surface, the first portion and the second portion of the second heat spreader forming an additional open-ended columnar channel.

3. The apparatus of claim 2, wherein the first heat spreader includes an additional portion mechanically coupled to at least one of the first portion and the second portion of the first heat spreader, the additional portion further extending along a contour of the second portion of the inner surface of the outer casing.

4. The apparatus of claim 2, wherein the at least one printed circuit board is two circuit boards and wherein the first heat spreader dissipates heat generated by electronic components on a first printed circuit board and the second heat spreader dissipates heat generated by electronic components on a second printed circuit board.

5. The apparatus of claim 2, wherein the first heat spreader and the second heat spreader are not thermally coupled to each other.

6. The apparatus of claim 1, further including a baffle element enclosed by the outer casing and perpendicular to an opening in the heat dissipation structure, the baffle element located beyond one end of the at least one printed circuit board, the baffle element including at least one opening for control of airflow through the heat dissipation structure.

7. The apparatus of claim 1, wherein the outer casing further includes a first vent structure located beyond a first end of the at least one printed circuit board and a second vent structure located beyond a second end of the at least one printed circuit board.

8. The apparatus of claim 1, wherein the at least one printed circuit board is vertically oriented and is parallel to the inner surface of the outer casing.

9. The apparatus of claim 1, further including a mounting ring that is mechanically attached to the heat dissipation structure, the mounting ring mounting between a first portion of the outer casing and a second portion of the outer casing, the mounting ring providing secure positioning of the heat dissipation structure within the outer casing.

10. The apparatus of claim 1, wherein the heat dissipation structure is formed as part of a casting process using zinc or aluminum or as part of a sheet bending process using aluminum or steel.

11. A heat management device, comprising:
a heat dissipation structure thermally coupled to a heat generating electronic structure, the heat dissipation structure forming an open-ended columnar channel, the open-ended columnar channel allowing air to flow within the heat dissipation structure in a direction parallel to a planar surface of the heat generating electronic structure, the heat dissipation structure including a first heat spreader, the first heat spreader having a first portion extending in a direction parallel to the planar surface of the heat generating structure and being thermally coupled to at least a portion of the planar surface of the heat generating structure, the first heat spreader also having a second portion extending along a contour of a first portion of the inner surface of an enclosure of an apparatus in which said heat management device is located and opposite the first portion, the first portion and second portion forming the open-ended columnar channel, the heat dissipation structure further including a second heat spreader, the second heat spreader having a first portion extending in a direction parallel to a different planar surface of the heat generating structure and being thermally coupled to at least a portion of the different planar surface of the heat generating structure, the second heat spreader also having a second portion extending along a contour of a second portion of the inner surface of the enclosure and opposite the first portion of the inner surface of the outer casing, the second portion of the inner surface being different from the first portion of the inner surface, the first portion and the second portion of the second heat spreader forming an additional open-ended columnar channel;
wherein the first heat spreader includes an additional portion mechanically coupled to at least one of the first portion and the second portion of the first heat spreader, the additional portion further extending along a contour of the second portion of the inner surface of the enclosure.

12. The heat management device of claim 11, wherein the heat generating structure is a printed circuit board and wherein the first heat spreader dissipates heat generated by electronic components on a first surface of the printed circuit board and the second heat spreader dissipates heat generated by electronic components on a second surface of the printed circuit board.

13. The heat management device of claim 11, wherein the first heat spreader and the second heat spreader are not thermally coupled to each other.

14. The heat management device of claim 11, further including a mounting ring that is mechanically attached to the heat dissipation structure, the mounting ring providing secure positioning of the heat dissipation structure within the enclosure for the heat management device.

15. The heat management device of claim 11, wherein the heat dissipation structure is formed as part of a casting process using zinc or aluminum or as part of a sheet bending process using aluminum or steel.

16. A heat management device, comprising:
a heat dissipation structure thermally coupled to a heat generating electronic structure, the heat dissipation structure forming an open-ended columnar channel, the open-ended columnar channel allowing air to flow within the heat dissipation structure in a direction parallel to a planar surface of the heat generating electronic structure; and
a mounting ring that is mechanically attached to the heat dissipation structure, the mounting ring providing secure positioning of the heat dissipation structure within the enclosure for the heat management device;
wherein the heat dissipation structure includes a first heat spreader, the first heat spreader having a first portion extending in a direction parallel to the planar surface of the heat generating structure and being thermally coupled to at least a portion of the planar surface of the heat generating structure, the first heat spreader also having a second portion extending along a contour of a first portion of the inner surface of an enclosure of an apparatus in which said heat management device is located and opposite the first portion, the first portion and second portion forming the open-ended columnar channel.

17. An apparatus comprising:
an outer casing enclosing a plurality of heat generating electronic components included on at least one printed circuit board, the outer casing having an inner surface and an outer surface;
a heat dissipation structure coupled to the at least one printed circuit board, the heat dissipation structure forming an open-ended columnar channel, the open-ended columnar channel allowing air to flow within the heat dissipation structure in a direction parallel to the at least one printed circuit board; and
a mounting ring that is mechanically attached to the heat dissipation structure, the mounting ring mounting between a first portion of the outer casing and a second portion of the outer casing, the mounting ring providing secure positioning of the heat dissipation structure within the outer casing;
wherein the heat dissipation structure includes a first heat spreader, the first heat spreader having a first portion extending in a direction parallel to a portion of the at least one printed circuit board and being thermally coupled to one of the plurality of electronic components mounted on the portion of the at least one printed circuit board, the first heat spreader also having a second portion extending along a contour of a first portion of the inner surface of the outer casing and opposite the first portion, the first portion and second portion forming the open-ended columnar channel.

18. An apparatus comprising:
an outer casing enclosing a plurality of heat generating electronic components included on at least one printed circuit board, the outer casing having an inner surface and an outer surface; and
a heat dissipation structure coupled to the at least one printed circuit board, the heat dissipation structure forming an open-ended columnar channel, the open-ended columnar channel allowing air to flow within the heat dissipation structure in a direction parallel to the at least one printed circuit board;
wherein the heat dissipation structure includes a first heat spreader, the first heat spreader having a first portion extending in a direction parallel to a portion of the at least one printed circuit board and being thermally coupled to one of the plurality of electronic components mounted on the portion of the at least one printed circuit board, the first heat spreader also having a second portion extending along a contour of a first portion of the inner surface of the outer casing and opposite the first portion, the first portion and second portion forming the open-ended columnar channel, the heat dissipation structure further includes a second heat spreader, the second heat spreader having a first portion extending in a direction parallel to at least a different portion of the at least one printed circuit board and being thermally coupled to one of the plurality of electronic components mounted on the different portion of the at least one printed circuit board, the second heat spreader also having a second portion extending along a contour of a second portion of the inner surface of the outer casing and opposite the first portion of the inner surface of the outer casing, the second portion of the inner surface being different from the first portion of the inner surface, the first portion and the second portion of the second heat spreader forming an additional open-ended columnar channel, and the first heat spreader also includes an additional portion mechanically coupled to at least one of the first portion and the second portion of the first heat spreader, the additional portion further extending along a contour of the second portion of the inner surface of the outer casing.

* * * * *